United States Patent
Hynecek

(10) Patent No.: US 9,252,185 B2
(45) Date of Patent: Feb. 2, 2016

(54) BACK SIDE ILLUMINATED IMAGE SENSORS WITH BACK SIDE CHARGE STORAGE

(71) Applicant: Semiconductor Components Industries, LLC, Phoenix, AZ (US)

(72) Inventor: Jaroslav Hynecek, Allen, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 257 days.

(21) Appl. No.: 14/024,316

(22) Filed: Sep. 11, 2013

(65) Prior Publication Data

US 2014/0077062 A1 Mar. 20, 2014

Related U.S. Application Data

(60) Provisional application No. 61/702,902, filed on Sep. 19, 2012.

(51) Int. Cl.
*H01L 27/00* (2006.01)
*H01L 27/148* (2006.01)
*H01L 27/146* (2006.01)

(52) U.S. Cl.
CPC .... *H01L 27/14887* (2013.01); *H01L 27/14601* (2013.01)

(58) Field of Classification Search
CPC .................. H01L 27/1464; H01L 27/14601; H01L 27/14603; H01L 27/14609; H01L 27/14614
USPC ............ 250/208.1, 214.1; 257/445, 447, 448, 257/460
See application file for complete search history.

(56) References Cited

U.S. PATENT DOCUMENTS

| | | |
|---|---|---|
| 5,625,210 A | 4/1997 | Lee et al. |
| 8,535,996 B2 | 9/2013 | Shaheen et al. |
| 2009/0201400 A1 | 8/2009 | Zhang et al. |
| 2010/0276574 A1 | 11/2010 | Manabe |
| 2012/0235212 A1* | 9/2012 | Chen et al. ............ 257/223 |
| 2012/0273653 A1 | 11/2012 | Hynecek |
| 2012/0273654 A1 | 11/2012 | Hynecek et al. |
| 2013/0153973 A1 | 6/2013 | Hynecek |
| 2013/0334637 A1* | 12/2013 | Wang et al. ............ 257/432 |

OTHER PUBLICATIONS

Hynecek et al., U.S. Appl. No. 13/086,363, filed Apr. 13, 2011.
Lenchenkov, U.S. Appl. No. 13/964,462, filed Aug. 12, 2013.
Yasutomi et al., "A 2.7e-Temporal Noise 99.7% Shutter Efficiency 92dB Dynamic Range CMOS Image Sensor with Dual Global Shutter Pixels", International Solid-State Circuits Conference, Session 22, Image Sensors, 2010 IEEE, Feb. 10, 2010.
"Sony Develops Next-generation Back-Illuminated CMOS Image Sensor which Embodies the Continuous Evolution of the Camera", Sony Corp. Info, [online], Jan. 23, 2012. <http://www.sony.net/SonyInfo/News/Press/201201/12-009E/>.

* cited by examiner

*Primary Examiner* — Kevin Pyo
(74) *Attorney, Agent, or Firm* — Treyz Law Group, P.C.; Michael H. Lyons; Joseph F. Guihan

(57) ABSTRACT

A back side illuminated image sensor may be provided with an array of image sensor pixels. Each image sensor pixel may include a substrate having a front surface and a back surface. The image sensor pixels may have a charge storage region formed at the back surface and a charge readout node formed at the front surface of the substrate. The image sensor pixels may receive image light at the back surface of the substrate. Photo-generated charge may be accumulated at the charge storage region during a charge integration cycle. Upon completion of the charge integration cycle, a transfer gate formed at the front surface may be pulsed high to move the charge from the charge storage region to the charge readout node. The charge may be converted to a voltage at the charge readout node and may be read out using a rolling shutter readout mode.

15 Claims, 3 Drawing Sheets

BACK SIDE ILLUMINATED IMAGE SENSORS WITH BACK SIDE CHARGE STORAGE

This application claims the benefit of provisional patent application No. 61/702,902, filed Sep. 19, 2012, which is hereby incorporated by reference herein in its entirety.

BACKGROUND

This relates to solid-state image sensor arrays and, more specifically, to image sensors with small size pixels that are illuminated from the back side of a pixel substrate. Small pixel sizes reduce the cost of manufacturing image sensor arrays, but it is important not to sacrifice image sensor performance when pixel size is reduced.

Conventional complementary metal-oxide-semiconductor (CMOS) image sensors sense light by converting impinging photons into electrons that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can sometimes be converted on-chip to a digital equivalent before being conveyed off-chip. Each pixel includes a buffer amplifier (i.e., source follower) that drives output sensing lines that are connected to the pixels via respective address transistors.

After the charge-to-voltage conversion is complete and after the resulting signals are transferred out from the pixels, the pixels are reset before a subsequent integration cycle begins. In pixels that include floating diffusions (FD) serving as the charge detection node, this reset operation is accomplished by momentarily turning on a reset transistor that connects the floating diffusion node to a voltage reference for draining (or removing) any charge transferred to the FD node. However, removing charge from the floating diffusion node using the reset transistor generates kTC-reset noise, as is well known in the art. This kTC noise must be removed using correlated double sampling (CDS) signal processing techniques in order to achieve desired low noise performance. Typical CMOS image sensors that utilize CDS require at least three transistors (3T) or four transistors (4T) per pixel. An example of the 4T pixel circuit with a pinned photodiode can be found in Lee (U.S. Pat. No. 5,625,210), incorporated herein as a reference.

In FIG. 1, a simplified drawing 100 of a pixel cross section is shown. As shown in drawing 100, a pixel substrate 101 includes p+ doped layer 102 deposited on the back surface of pixel substrate 101, which prevents the generation of excessive dark current by interface states. Substrate 101 includes epitaxial p-type doped layer 115 formed on top of p+ layer 102. Photons 90 that enter p-type doped layer 115 generate carriers that are collected in the potential well of the photodiode formed in region 108 at the front surface of substrate 101. The front (upper) surface of epitaxial p-type doped layer 115 is covered by oxide layer 109 that isolates doped polysilicon charge transfer (TX) gate 110 from substrate 101. Transfer gate 110 includes masking oxide 111 deposited on an upper surface of transfer gate 110 that serves as a patterning hard mask as well as an additional blocking mask for ion implantation that forms the photodiode storage region.

The photodiode is formed by the p+ type doped potential pinning layer 107 and n-type doped layer 108 at the front surface of substrate 101. P+ type doped layer 107 reduces dark current generated by the interface states. Charge generated by impinging photons 90 is accumulated at region 108. Gate 110 includes sidewall spacers 116 formed on each side of gate 110 to control the mutual edge positions of p+ type doped layer 107 and charge storage layer 108. Floating diffusion (FD) diode 104 formed at the front surface of substrate 101 senses charge transferred from region 108 (i.e., as shown by arrow 121, charge is transferred from region 108 at the front side of pixel substrate 101 to region 104 at the front side of pixel substrate 101). Floating diffusion 104 is connected to a source follower (SF) transistor (not shown). The floating diffusion diode, source follower, and other pixel circuit components are built within p-type doped well 103.

The pixels are isolated from each other by p+ type doped regions 105 and 106 that may extend through epitaxial p-type doped layer 115 down to p+ type doped layer 102. The pixel is covered by inter-level (IL) oxide layers 112 that are used for the pixel metal wiring and interconnect isolation. The active pixel circuit components are connected to the wiring by metal via 114 deposited through contact holes 113.

As shown in drawing 100, a large portion of valuable pixel area is occupied by transfer gate 110. Other pixel circuit components (not shown) also occupy a large portion of the pixel, so there is not enough substrate area left for the photodiode that is disposed in a lateral direction from gate 110. This can lead to low photodiode charge storage capacity, poor pixel dynamic range, and poor noise performance.

In some cases, two pixel substrates are stacked on top of each other, with one substrate having a built in photodiode and the other substrate carrying the rest of the pixel circuits. An example of two substrate stacked pixel a can be found in http://www.sony.net/SonyInfo/News/Press/201201/12-009E/ by Sony. However, when stacking the two substrates, the substrates must be electrically connected using wafer-to-wafer contacts and must be precisely aligned, resulting in increased fabrication difficulty and high manufacturing costs.

It would therefore be desirable to be able to provide improved image sensors without a stacking requirement.

DETAILED DESCRIPTION

Figure 1:
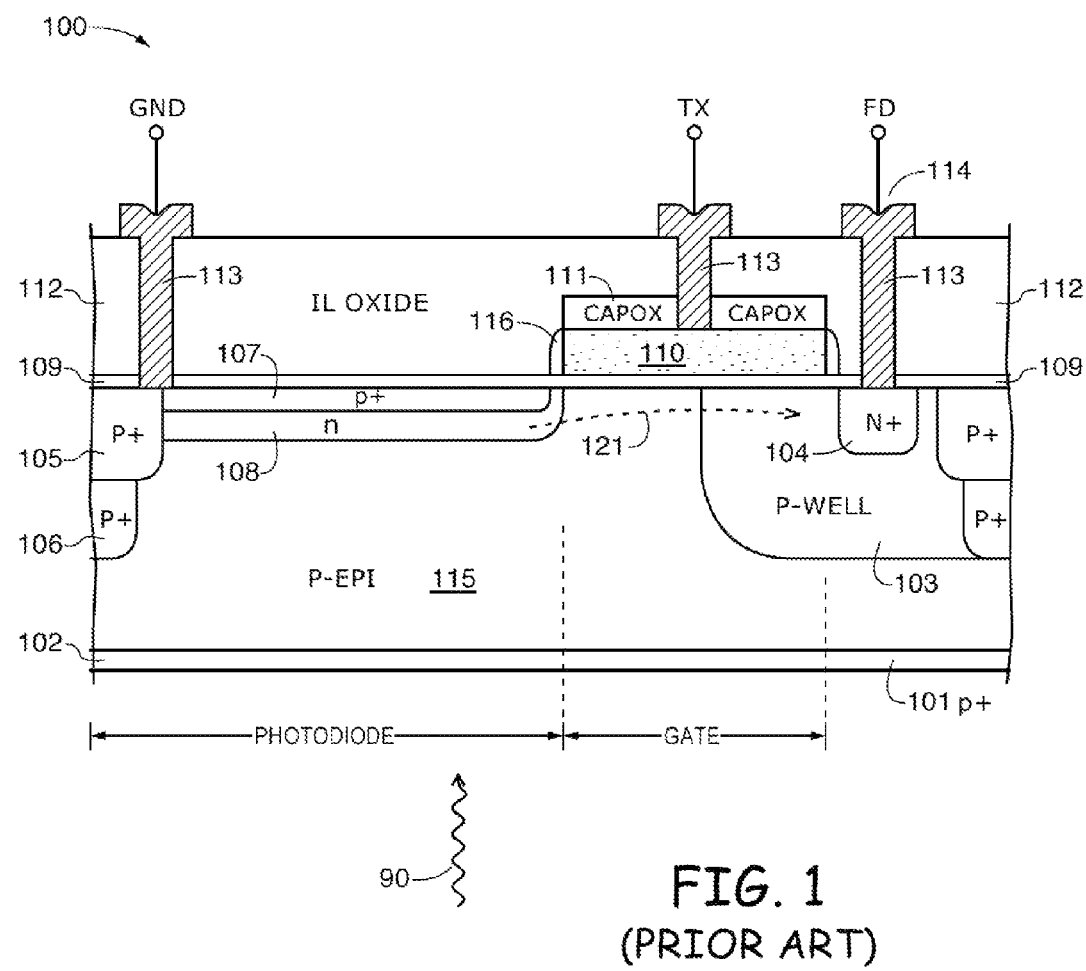
FIG. 1 is a simplified cross-sectional side view of a conventional image sensor pixel having a charge storage region and floating diffusion diode at the front-side of a pixel substrate.
Figure 2:
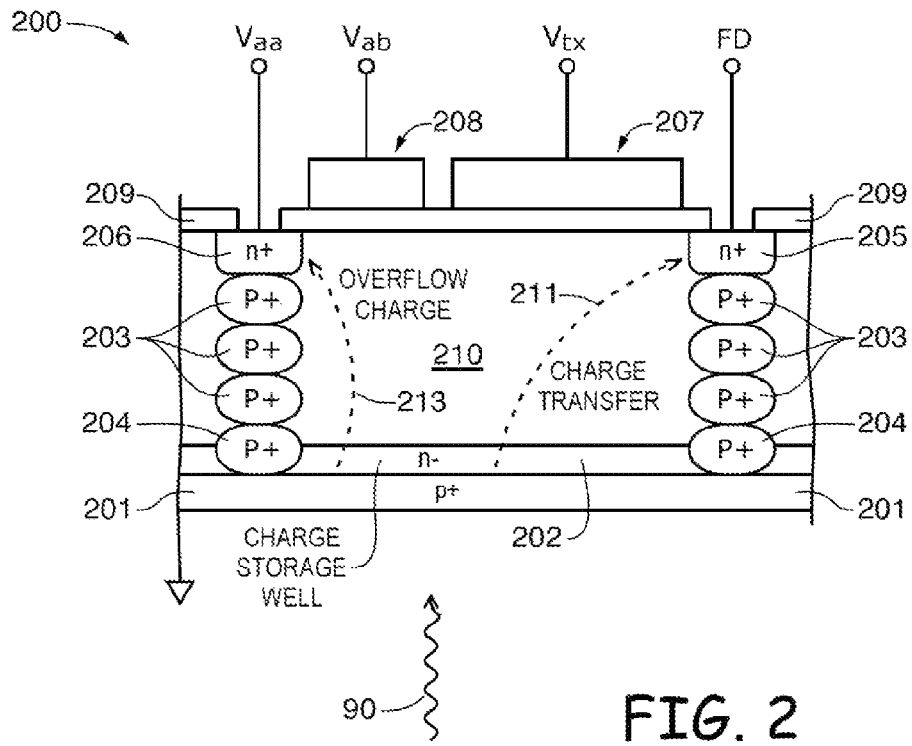
FIG. 2 is a simplified cross-sectional side view of a pixel having charge storage well doping at the back side of a pixel substrate, back side charge pinning doping, a front side anti-blooming control gate, a front side overflow charge drain, and a front side floating diffusion node in accordance with an embodiment of the present invention.

In FIG. 2, drawing 200 shows a cross-sectional side view of an illustrative back-side illuminated (BSI) image pixel (sometimes referred to herein as image pixel 200). An image sensor may be formed from an array of pixels such as pixel 200 arranged in rows and columns. The image sensor pixels may be fabricated on a substrate such as substrate 210. Substrate 210 has a top (front) surface and a bottom (back) surface. Image sensing circuitry such as transistors and interconnect structures may be formed on the front side of substrate 210. A p+ type doping layer such as p+ doping layer 201 may be formed (deposited) on the bottom surface of substrate 210. P+ type doping layer 201 may suppress dark current generated by interface states.

During operation, image photons 90 may be received by the image sensing means through the back side (rear surface) of substrate 210. In particular, the rear surface of the pixel array (i.e., the back side of the semiconductor substrate) may be exposed to an image to be captured. Photons 90 may enter substrate 210 through the back surface and generate carriers (e.g., electron-hole pairs) in region 210.

An n− type doping layer such as n− doping layer 202 may be formed at the back side of substrate 210 (e.g., n− doping layer 202 may be formed at the upper surface of p+ type doping layer 201). A potential well may be formed at n− layer 202 and n− layer 202 may collect photon-generated carriers (e.g., carriers generated at region 210 in response to image photons 90). N− type doped layer 202 formed at the back side of substrate 210 may result in the formation of a potential well sometimes referred to herein as a charge storage well.

P-type implants (e.g., p+ type doped regions) 203 may be formed in substrate 210 to isolate each pixel in the array from each other. P-type implant 204 may be formed at least partially within n− type doping layer 202 to separate the charge storage wells of multiple pixels in the pixel array from each other and to prevent charge from multiple pixels from mixing together (e.g., to prevent pixel cross talk).

Charge transfer gate 207 (e.g., a polysilicon gate structure, a metal gate structure, or other types of conductive gate structures) may be formed at the front surface of substrate 210. A charge readout node may be formed at the front surface of substrate 210. The charge readout node may include floating diffusion (FD) 205 formed at the front side of substrate 210 (e.g., an n+ type doped floating diffusion region). Charge transfer gate 207 may receive charge transfer control signal Vtx (e.g., from pixel control circuitry that is not shown for the sake of simplicity). During operation, charge transfer gate 207 is normally biased low (e.g., transfer gate control signal Vtx is normally biased low). For example, charge transfer gate 207 may be biased low during a charge integration cycle in which charge (e.g., photon-generated carriers) is stored at n− type doping layer 202. When charge transfer gate 207 is momentarily pulsed high (e.g., during a charge transfer cycle), charge from back side storage well 202 is transferred to front side floating diffusion 205 (as shown by arrow 211) and the corresponding voltage signal may be readout (e.g., by pixel readout circuitry coupled to node 205 that is not shown for the sake of simplicity).

Anti-blooming control gate 208 (e.g., a polysilicon gate structure, a metal gate structure, or other types of conductive gate structures) is formed on the front surface of substrate 210. Anti-blooming control gate 208 may be laterally separated from charge transfer gate 207. Drain diffusion 206 (e.g., an n+ type doped drain diffusion region) may be formed at the front surface of substrate 210 adjacent to anti-blooming control gate 208. Anti-blooming control gate 208 may receive anti-blooming gate control signal $V_{ab}$ from the pixel control circuitry. Anti-blooming control gate 208 may be biased at an intermediate bias level during the charge integration cycle (e.g., control signal $V_{ab}$ may be biased at an intermediate bias level that is less than the high bias level and greater than the low bias level), allowing overflow charge stored at potential well 202 to flow into drain diffusion 206, as shown by arrow 213. Anti-blooming control gate 208 may be biased low during the charge transfer cycle, preventing charge from flowing to drain diffusion 206.

Gate oxide layer 209 may be interposed between substrate 210 and gates 207 and 208. Gates 207 and 208 may be isolated from substrate 210 by gate oxide layer 209. Gate oxide layer 209 may substantially cover the entire surface of the pixel array. Metal interconnect wiring layers may be formed over the front side of substrate 210 and may be used to supply pixel control signals to the pixels (e.g., to supply signals $V_{ab}$ and Vtx to gates 208 and 207, respectively). Additional inter-level dielectric layers (not shown) may be deposited over gates 207 and 208 to isolate the metal interconnect wiring layers. Each pixel 200 may include source follower transistors, addressing transistors, and reset transistors (e.g., source follower transistors, addressing transistors, and reset transistors may be formed at the front surface of substrate 210). The source follower transistor may include a drain and a source. If desired, the pixel addressing transistor may be connected in series with the source follower drain. In another suitable arrangement, the pixel addressing transistor may be connected in series with the source of the source follower.

By storing charge in potential well 202 located at the back side of substrate 210, pixel 200 of FIG. 2 may minimize the pixel area occupied by transfer gate 207 and other pixel circuitry (e.g., charge storage region 202 may extend between pixel isolation implants 204 formed at opposing sides of pixel 200). During pixel readout, charge may be transferred from the storage region 202 at the back side of substrate 210 to the front side of substrate 210 where it is stored at floating diffusion node 205. The charge may be subsequently converted to a voltage equivalent at floating diffusion node 205. Signal processing circuits may be coupled to pixel 200. An input terminal of the signal processing circuits may be coupled to node 205. Voltage signals may be transferred to the signal processing circuits during readout and may be read out.

If desired, node 205 may be reset and a first voltage on node 205 may be detected and stored in storage circuitry (e.g., storage circuitry formed at the periphery of the array) prior to transferring charge from back side storage region 202 to floating diffusion node 205. Charge stored at back side storage region 202 may be subsequently transferred to floating diffusion node 205. After charge is transferred from back side storage well 202 to floating diffusion node 205, a second voltage may be read out from node 205 and the previously stored first voltage value (e.g., a reset voltage value) may be subtracted from the second read out voltage value. This procedure is sometimes referred to as correlated double sampling (CDS). By performing CDS, pixel 200 may eliminate kTC-reset noise, since only a voltage difference resulting from transferred charge may result in a valid image signal.

Charge transfer and readout from pixel 200 may be performed using a row-by-row rolling shutter mode, in which each pixel in the pixel array is read out row-by-row (e.g., pixel 200 having back side charge storage at storage region 202 may be readout using a rolling shutter algorithm). When operating in rolling shutter mode, floating diffusion node 205 may be reset, charge may be transferred from back side region 202 to floating diffusion node 205, charge may be converted to a voltage, and the voltage may be read out from each pixel in the pixel array on a row-by-row basis. For example, floating diffusion 205 may be reset and a reset voltage level may be read out for each pixel in a first row of the pixel array. Charge may then be transferred from back side storage region 202 to front side floating diffusion node 205, converted to a voltage, and read out for each pixel in the first row of the array. After the first pixel row has been read out, floating diffusions 205 of the second row may be reset and a reset voltage level may be read out for each pixel in the second row of the pixel array. Charge may then be transferred from back side storage region 202 to front side floating diffusion node 205 and subsequently converted to a voltage and read out for each pixel in the second row of the pixel array. This process may be repeated with the remaining pixel rows in the array until the entire pixel array has been read out. In this way, kTC-reset noise may be eliminated for the entire pixel array.

Figure 3:
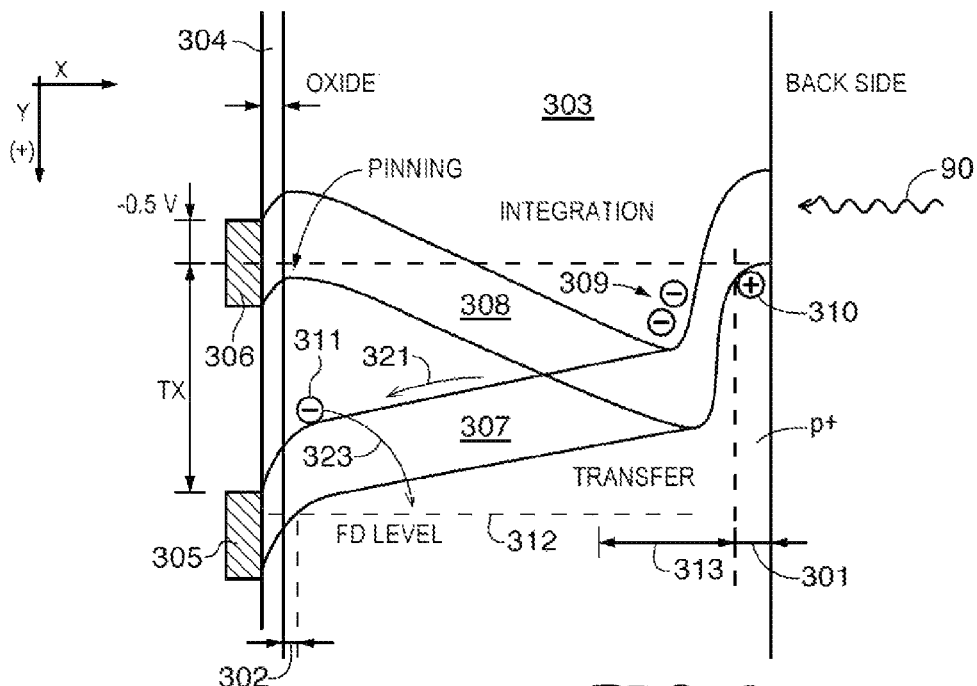
FIG. 3 is a potential diagram across a pixel of the type shown in FIG. 2 that shows how charge is stored at the back side of the pixel substrate during a charge integration period and how charge flows during charge transfer to a floating diffusion at the front side of the pixel substrate for readout in accordance with an embodiment of the present invention.

FIG. 3 is a simplified potential diagram illustrating the potential profile of a pixel such as image sensor pixel 200 of FIG. 2 during operation. FIG. 3 corresponds to the flow of electrons as they move through the cross-section of the pixel structure shown in FIG. 2, from back side charge storage layer 202 to floating diffusion 205. As shown in FIG. 3, the pixel may be built into low-doped semiconductor material 303 (e.g., silicon). For example, region 303 may correspond to substrate 210 of FIG. 2. In scenarios where region 303 is a p-type material, most of region 303 may be completely depleted of holes. An un-deplete p+ potential pinning layer 301 may be deposited on the back side of region 303 to prevent generation of dark current from interface states by accumulating holes 310 at pinning layer 301.

A potential well may be formed at n-type doped region 313 (e.g., a region formed by an n-doped material such as region 202 formed at the back side of substrate 210 of FIG. 2). During the charge integration cycle, charge transfer gate 207 may be biased low at level 306. When charge transfer gate 207 is biased to low level 306, the silicon energy bands are at position 308 and the potential profile forms a potential well 309 in which electrons are accumulated. During the charge transfer cycle, charge transfer gate 207 may be biased high at level 305. When charge transfer gate 207 is biased at high level 305, the silicon energy bands are shifted to position 307 and electrons will flow from region 309 to region 311 under the charge transfer gate, as shown by arrow 321. Electrons at region 311 may subsequently flow from region 311 to the floating diffusion region (e.g., floating diffusion 205 of FIG. 2), which is biased at level 312 (e.g., as shown by arrow 323).

Oxide layer 304 may isolate the gates from substrate 303 (e.g., oxide layer 304 may correspond to oxide layer 209 of FIG. 2). Additional p-type doped region 302 may be implanted under the gates to prevent generation of dark current when charge transfer gate 207 is biased low. Other pixel structures shown in FIG. 2 such as a potential profile under blooming control gate 208, are not shown for the sake of simplicity. Various IL metal layers and metal interconnect layers on top of the pixel are also not shown for the sake of simplicity. If desired, various dielectric layers, light shields, color filters, micro-lenses, or any other desired image sensor components may be formed over the back side of substrate 303 (e.g., where light 90 enters substrate 303), and are not shown for the sake of simplicity.

The example of FIGS. 2 and 3 is merely illustrative. If desired, substrate 210 may be formed from any other desired semiconductor materials. For example, substrate 210 (region 303) may be formed from a lightly doped n-type material or from a lightly doped p-type material. In scenarios where region 303 is formed from a lightly doped n-type material, photo-generated holes may be accumulated at potential well region 309. In this scenario, the doping of floating diffusion 205 and anti-blooming drain 206 is replaced with p+ type doping (e.g., the doping polarity shown in FIG. 2 would be reversed). If desired, n-type and/or p-type implants may be formed throughout the silicon under charge transfer gate 207 to suitably shape the potential profile in this region and to achieve complete charge transfer without any carrier trapping in parasitic wells.

Figure 4:
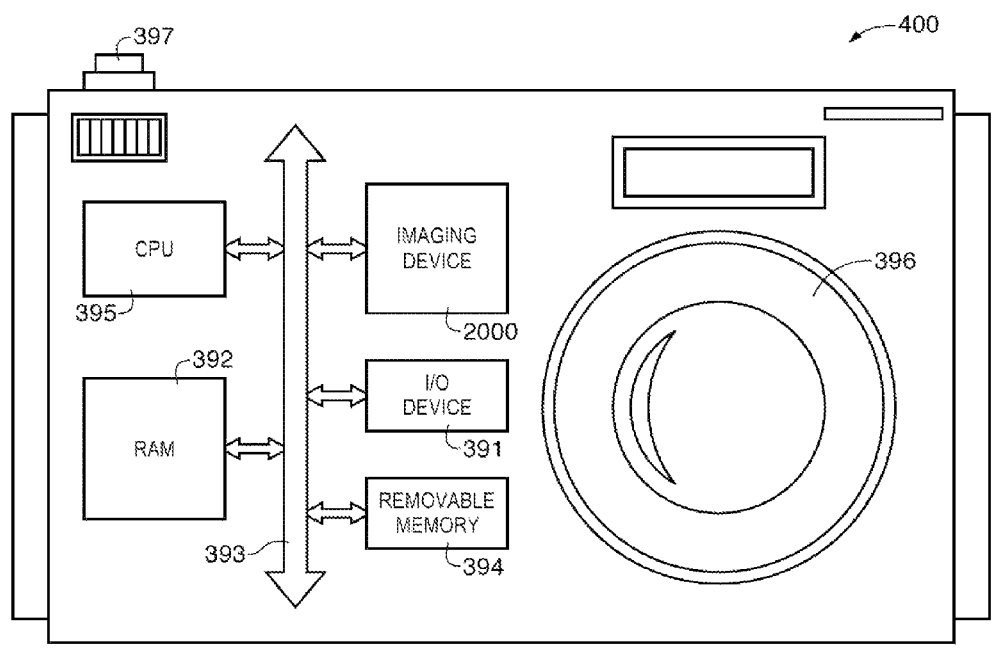
FIG. 4 is a block diagram of a processor system employing the image sensor of FIGS. 2 and 3 in accordance with an embodiment of the present invention.

FIG. 4 shows in simplified form a typical processor system 400, such as a digital camera, which includes an imaging device such as imaging device 2000 (e.g., an imaging device 2000 such as an image sensor that includes the backside illuminated pixels having back side charge storage regions as described above in connection with FIGS. 2 and 3). Processor system 400 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 400, which may be a digital still or video camera system, may include a lens such as lens 396 for focusing an image onto a pixel array when shutter release button 397 is pressed. Processor system 400 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 2000 may also communicate with CPU 395 over bus 393. System 400 may include random access memory (RAM) 392 and removable memory 394. Removable memory 394 may include flash memory that communicates with CPU 395 over bus 393. Imaging device 2000 may be combined with CPU 395, with or without memory storage, on a single integrated circuit or on a different chip. Although bus 393 is illustrated as a single bus, it may be one or more buses or bridges or other communication paths used to interconnect the system components.

Having thus described the preferred embodiments of the novel pixel design that has the capability of storing charge in a potential well located at the back side of a pixel substrate and transferring it for readout onto a floating diffusion node located at the front side of the substrate where the rest of the pixel circuits are located, it is noted that principles of this invention and various modifications can be made by those skilled in the art without departing from the scope and spirit of the invention.

Various embodiments have been described illustrating a back side illuminated image sensor pixel that can operate in a rolling shutter mode. The image sensor pixel can include a substrate a substrate having opposing front and back surfaces. The image sensor pixel is illuminated with image light through the back surface.

The image sensor pixel can include a charge storage region formed at the back surface of the substrate that accumulates photo-generated charge during a charge integration cycle and a charge readout node (e.g., a floating diffusion node) formed at the front surface of the substrate. A charge transfer gate and an anti-blooming control gate may be formed at the front surface of the substrate. After completing the charge integration cycle, charge from the back side charge storage region can be transferred to the front side charge readout node using the charge transfer gate for detection and conversion to a voltage. The voltage may be read out from the pixel using a rolling shutter mode and with minimal kTC-reset noise. Forming the charge storage region at the back side of the pixel results in improved charge storage capacity, and in turn improved pixel dynamic range and noise performance.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel comprising:
    a substrate having opposing front and back surfaces, wherein the substrate comprises a p-type doped substrate;
    a charge storage region formed at the back surface of the substrate, wherein the charge storage region is configured to accumulate photo-generated charge, and wherein the charge storage region comprises an n-type doping layer; and
    a charge readout node formed at the front surface of the substrate, wherein the charge readout node is configured to receive the accumulated photo-generated charge from the charge storage region, wherein the charge readout node comprises an n-type doped floating diffusion region, and wherein only p-type doped silicon is interposed between the charge storage region and the charge readout node.

2. The image sensor pixel defined in claim 1, further comprising:
    a transfer gate formed at the front surface of the substrate, wherein the transfer gate is configured to transfer the accumulated photo-generated charge from the charge storage region to the charge readout node.

3. The image sensor pixel defined in claim 2, wherein the photo-generated charge accumulated at the charge storage region comprises electrons.

4. The image sensor pixel defined in claim 2, wherein the photo-generated charge accumulated at the charge storage region comprises holes.

5. The image sensor pixel defined in claim 2, further comprising:
    a blooming drain region formed at the front surface of the substrate; and
    a blooming control gate formed at the front surface of the substrate, wherein the blooming control gate is configured to transfer overflow charge from the charge storage region to the blooming drain region.

6. The image sensor pixel defined in claim 5, wherein the image sensor pixel is coupled to additional image sensor pixels and wherein the blooming control gate is shared between the image sensor pixel and the additional image sensor pixels.

7. The image sensor pixel defined in claim 1, wherein the n-type doped floating diffusion region is formed at the front surface of the substrate.

8. The image sensor defined in claim 7, further comprising:
    analog-to-digital converter circuitry formed at the front surface of the substrate and coupled to the floating diffusion node, wherein the analog-to-digital converter circuitry is configured to convert an analog image signal received from the floating diffusion node into a digital image signal.

9. The image sensor pixel defined in claim 7, further comprising:
    a source follower transistor formed at the front surface of the substrate;
    an addressing transistor formed at the front surface of the substrate; and
    a reset transistor formed at the front surface of the substrate.

10. The image sensor pixel defined in claim 9, wherein the source follower transistor has a source and a drain and wherein the addressing transistor is connected in series with the drain of the source follower transistor.

11. The image sensor pixel defined in claim 9, wherein the source follower transistor has a source and a drain and wherein the addressing transistor is connected in series with the source of the source follower transistor.

12. The image sensor pixel defined in claim 1, further comprising:
    a color filter, wherein the color filter is formed over the back surface of the substrate.

13. The image sensor pixel defined in claim 12, further comprising:
    a microlens, wherein the microlens is formed over the back surface of the substrate.

14. A system, comprising:
    a central processing unit;
    memory;
    input-output circuitry; and
    an imaging device, wherein the imaging device comprises
        a pixel array having at least one pixel circuit, the at least one pixel circuit comprising:
        a substrate having opposing front and back surfaces;
        a charge storage region formed at the back surface of the substrate, wherein the charge storage region is configured to accumulate photo-generated charge;
        a charge readout node formed at the front surface of the substrate, wherein the charge readout node is configured to receive the accumulated photo-generated charge photo from the charge storage region and wherein the charge readout node is configured to convert the accumulated photo-generated charge to a voltage;
        a charge transfer gate formed at the front surface of the substrate adjacent to the charge readout node, wherein the charge transfer gate is configured to transfer the accumulated photo-generated charge from the charge storage region to the charge readout node;
        a blooming drain region formed at the front surface of the substrate; and
        a blooming control gate formed at the front surface of the substrate adjacent to the charge transfer gate, wherein the blooming control gate is configured to transfer overflow charge from the charge storage region to the blooming drain region while photo-generated charge is being accumulated at the charge storage region, and wherein the charge readout node comprises a floating diffusion node and wherein the charge transfer gate is configured to transfer the accumulated photo-generated charge from the charge storage region to the floating diffusion node while the blooming control gate is biased low.

15. An image sensor pixel comprising:
    a substrate having opposing front and back surfaces, wherein the substrate comprises an n-type doped substrate;
    a charge storage region formed at the back surface of the substrate, wherein the charge storage region is configured to accumulate photo-generated charge, and wherein the charge storage region comprises a p-type doping layer; and
    a charge readout node formed at the front surface of the substrate, wherein the charge readout node is configured to receive the accumulated photo-generated charge from the charge storage region, wherein the charge readout node comprises a p-type doped floating diffusion region, and wherein only n-type doped silicon is interposed between the charge storage region and the charge readout node.

\* \* \* \* \*